United States Patent [19]

Haramoto et al.

[11] 4,363,007

[45] Dec. 7, 1982

[54] NOISE REDUCTION SYSTEM HAVING SERIES CONNECTED LOW AND HIGH FREQUENCY EMPHASIS AND DE-EMPHASIS FILTERS

[75] Inventors: Yutaka Haramoto; Yukinobu Ishigaki; Kaoru Totsuka; Takao Kawasaki, all of Yokohama, Japan

[73] Assignee: Victor Company of Japan, Limited, Yokohama, Japan

[21] Appl. No.: 256,825

[22] Filed: Apr. 23, 1981

[30] Foreign Application Priority Data

Apr. 24, 1980 [JP] Japan .................................. 55-54657

[51] Int. Cl.³ .............................................. H04B 1/64
[52] U.S. Cl. ..................................... 333/14; 307/271
[58] Field of Search ............................. 333/14; 455/72

[56] References Cited

U.S. PATENT DOCUMENTS 3,795,876  3/1974  Takahashi et al. ..................... 333/14
4,200,889  4/1980  Strobele ........................... 333/14 X

*Primary Examiner*—Paul L. Gensler
*Attorney, Agent, or Firm*—Lowe, King, Price & Becker

[57] ABSTRACT

In a noise reduction system including a compressor and an expander having a complementary frequency response characteristic to the frequency response characteristic of the compressor, the compressor includes a high frequency emphasis variable frequency filter and a low frequency emphasis variable gain filter which are connected in a series circuit between input and output terminals and which respectively vary their parameters in response to the respective high and low frequency components of the compressor output. The expander includes a high frequency de-emphasis variable frequency filter and a low frequency de-emphasis variable gain filter which are connected in a series circuit between input and output terminals and which respectively vary their parameters in response to the respective high and low frequency components of the expander input.

7 Claims, 6 Drawing Figures

NOISE REDUCTION SYSTEM HAVING SERIES CONNECTED LOW AND HIGH FREQUENCY EMPHASIS AND DE-EMPHASIS FILTERS

BACKGROUND OF THE INVENTION

The present invention relates to a noise reduction system in which the high and low frequency parts of the spectrum of a signal are emphasized respectively prior to transmission or recording and upon reception or reproduction the corresponding frequency parts of the received signal are de-emphasized respectively.

In a prior art noise reduction system, the spectrum of a signal is divided into different frequency bands by filters at a transmitter or recorder and the frequency divided components are controlled by variable gain amplifiers respectively in response to their amplitudes and combined in an adder to generate an output signal which is negatively summed with the original signal so that the latter is compressed in amplitude. At a receiver or reproducing apparatus, the received signal is divided into frequency bands corresponding to the frequency bands of the transmitter and the frequency divided components are controlled by variable gain amplifiers respectively in response to their amplitudes and combined in an adder to generate an output so that the amplitude of the received signal is expanded to restore the original signal. This prior art system however is susceptible to drop-outs or relatively large level fluctuations and tends to degrade its frequency response characteristic if there is a discrepancy between the cut-off frequencies of the frequency dividing filters.

SUMMARY OF THE INVENTION

Accordingly, an object of the invention is to provide a noise reduction system which is immune to drop-outs or relatively large fluctuations which occur during transmission or reproduction.

Another object of the invention is to provide a noise reduction system which permits high fidelity recording of signals in the higher frequency range of the audio spectrum.

The noise reduction system of the present invention comprises a compressor and an expander. The compressor comprises a high frequency emphasis variable frequency filter circuit and a low frequency emphasis variable gain filter circuit which are series connected between input and output terminals and which are respectively responsive to the level of high and low frequency components of a compressor output signal such that the cutoff frequency of the high frequency emphasis circuit is shifted to the higher frequency end of the spectrum as a function of the level of the high frequency component and the amount of low frequency emphasis is varied inversely as a function of the level of the low frequency component. The expander comprises a high frequency de-emphasis variable frequency filter circuit and a low frequency de-emphasis variable gain filter circuit which are series connected between input and output terminals and which are respectively responsive to the level of high and low frequency components of an expander input signal such that the cutoff frequency of the high frequency de-emphasis circuit is shifted to the higher frequency end as a function of the level of the high frequency component of the expander input and the amount of low frequency de-emphasis is varied inversely as a function of the level of the low frequency component of the expander input.

To achieve high fidelity recording of signals in the higher frequency range of the audio spectrum, the amount of low frequency emphasis of the compressor is held at a minimum when the low frequency component input level is above a predetermined value and the cutoff frequency of the high frequency emphasis variable frequency circuit is lower than the highest cutoff frequency thereof when the high frequency component input level is at the predetermined value. This disables the compression with respect to lower frequency signals when their signal levels are higher than the predetermined value while permitting the compression to be effected on higher frequency signals even though their input levels are higher than the predetermined value. Similarly, the amount of low frequency de-emphasis of the expander is held at a minimum when the expander's low frequency component input level is above a predetermined value and the cutoff frequency of the high frequency de-emphasis variable frequency circuit is lower than the highest cutoff frequency value thereof when the expander's low frequency component input level is at the predetermined value.

BRIEF DESCRIPTION OF THE DRAWINGS

The invention will be further described by way of example with reference to the accompanying drawings, in which.

DETAILED DESCRIPTION

Figure 1:
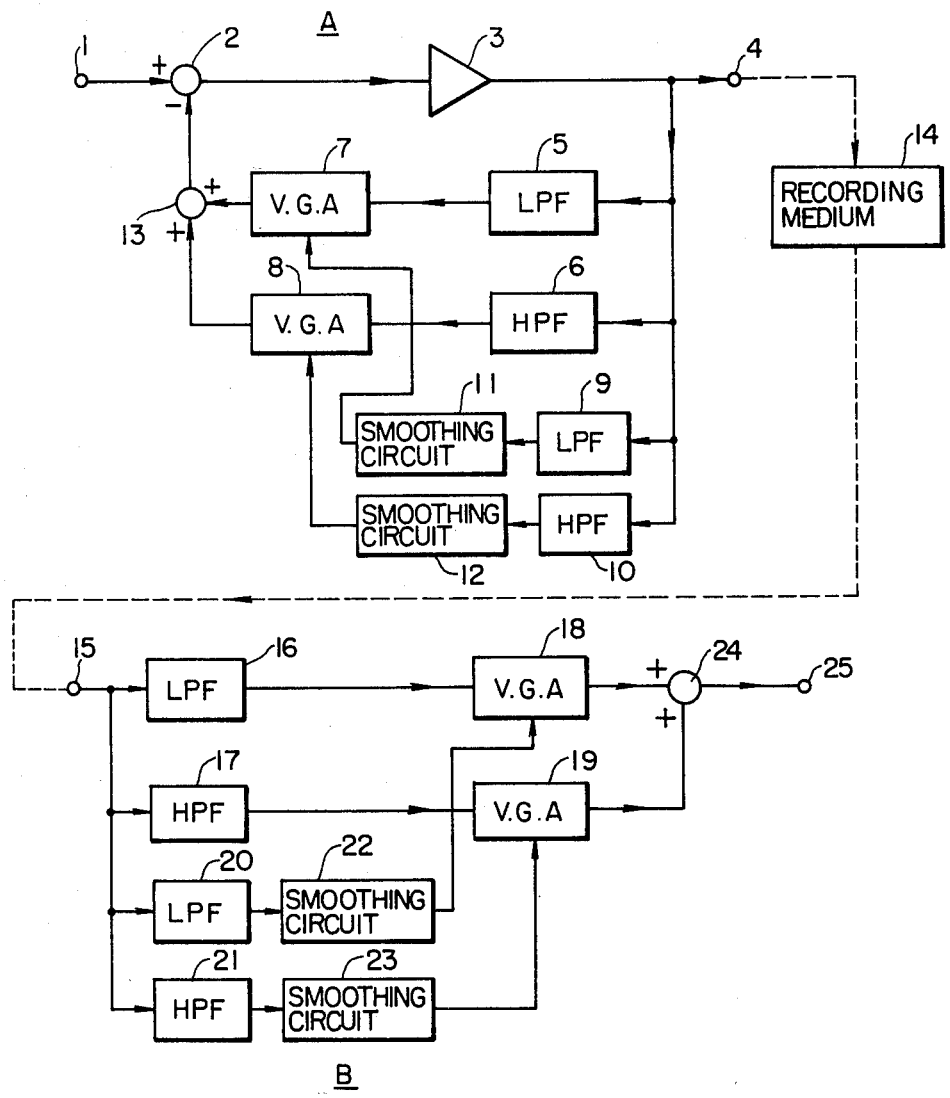
FIG. 1 is an illustration of a block diagram of an embodiment of the prior art noise reduction system.

Before describing the embodiment of the present invention reference is first had to FIG. 1 in which the prior art noise reduction system is schematically illustrated as generally comprising a compressor circuit A and an expander circuit B which are coupled through a recording medium or a transmission medium. The compressor circuit A comprises a main channel including a subtractor 2 and a linear amplifier 3 which are connected in series between input and output terminals 1 and 4, and a feedback circuit. This feedback circuit includes a low-pass filter 5, a high-pass filter 6 having their inputs connected together to the output terminal 4 to supply their output signals to variable gain amplifiers 7 and 8, respectively. The outputs of the variable gain amplifiers 7, 8 are connected to inputs of an adder 13 whose output is connected to a negative input of the subtractor 2. The filters 5 and 6 are designed so that their cut-off frequencies correspond to each other so that the full spectrum range is divided into low and high frequency bands. The signal at the output terminal 4 is also connected to a low-pass filter 9 and a high-pass filter 10 whose cut-off frequencies may be separated from one another. The output signals from the filters 9 and 10 are smoothed out by smoothing circuits 11 and 12, respectively, to generate control signals for application to the control terminals of the variable gain amplifiers 7 and 8. The amplifier gains of the amplifiers 7 and 8 are controlled inversely proportional to the amplitude of the respective low and high frequency signals so that their dynamic ranges are compressed independently of each other. The compressed signal is recorded into the recording medium 14 and reproduced for application to an input terminal 15 of the expander circuit B. The expander circuit B is similar to the feedback control circuit of the compressor circuit A with the exception that the operating characteristics of variable gain amplifiers 18 and 19 are complementary to the operating characteristics of the variable gain amplifiers 7 and 8, respectively. Filters 16 and 17 correspond respectively to the filters 5 and 6 of the compressor, filters 20 and 21 corresponding to the filters 9 and 10 respectively for supplying control signals via smoothing circuits 22 and 23 to the amplifiers 18, 19. The outputs of the amplifiers 18, 19 are combined in an adder 24 for application to an output terminal 25.

One drawback of this prior art system resides in the fact that if there is any discrepancy between the cut-off frequencies of the low-pass filter 5 and high-pass filter 6 (or 16 and 17), the frequency response characteristics of the full spectrum range are adversely affected, resulting in a system having a poor fidelity. Another drawback is that the prior art system requires the adders 13 and 24 which tend to act as sources of error due to tolerances since they affect the relative components of the combined signals. Due to the use of variable gain amplifiers the output signal will have a large amplitude variations in response to drop-outs, or relatively large input fluctuations.

Figure 2:
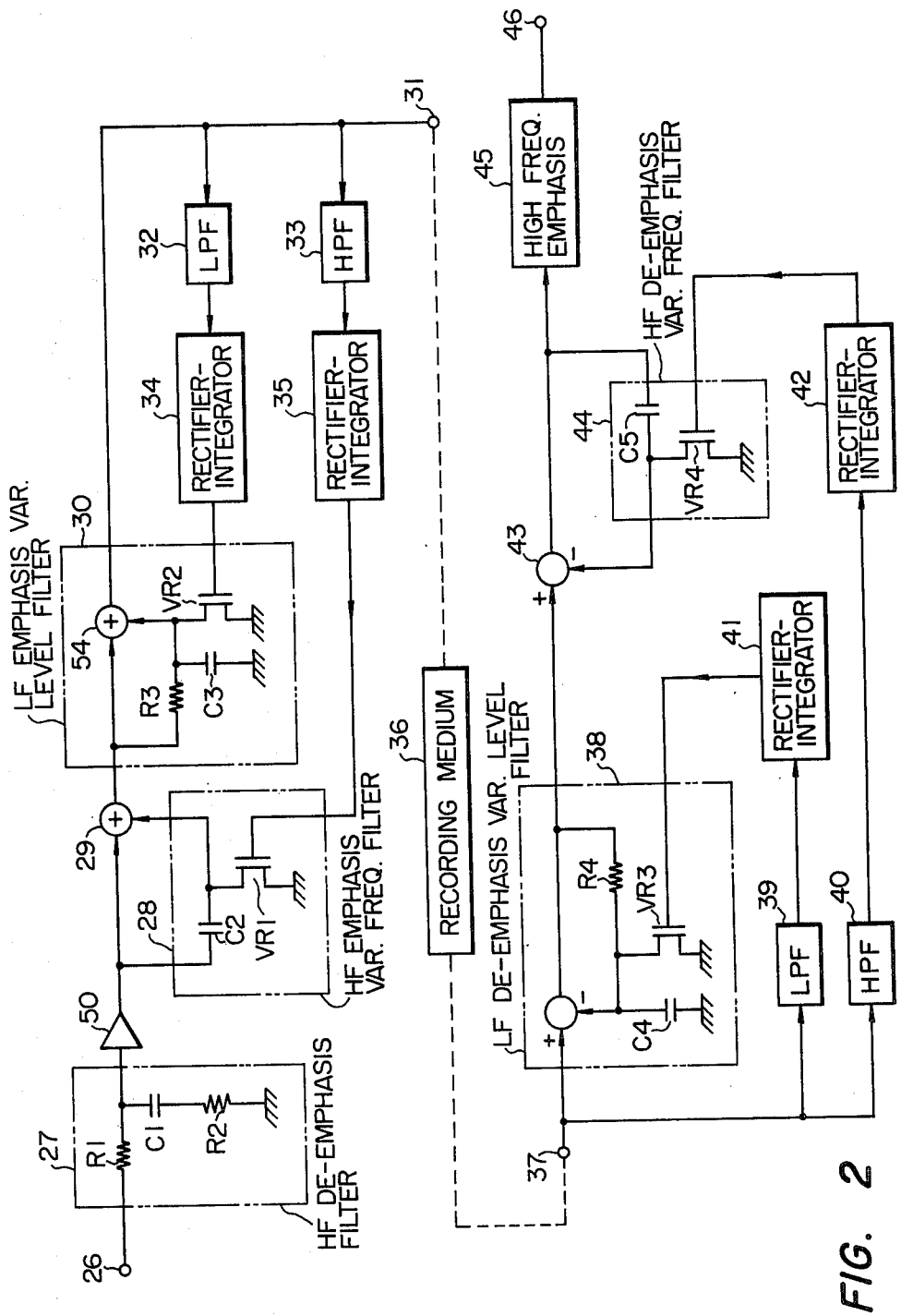
FIG. 2 is an illustration of a block diagram of an embodiment of the present invention.
Figure 3:
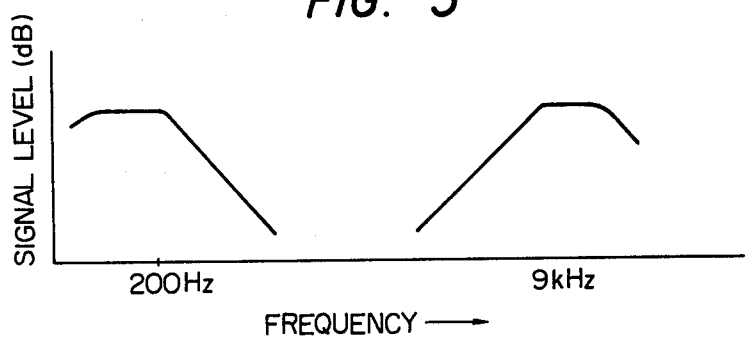
FIG. 3 is a graphic illustration of the frequency response characteristics of the lowpass and highpass filters of the embodiment of FIG. 2.

FIG. 2 is an illustration of the noise reduction system of the present invention. The system comprises a compressor circuit including a high frequency de-emphasis filter 27 receptive of an input signal impressed on a terminal 26, a high frequency emphasis variable frequency filter 28 connected via buffer amplifier 50 to the output of the filter 27, an adder 29 which combines the outputs of the amplifier 50 and the filter 28 and a low frequency emphasis variable level filter 30 which is impressed with the combined signal from the adder 29. To the output of the filter 30 are connected a lowpass filter 32 and a highpass filter 33 whose frequency response characteristics are indicated respectively by the left-hand and right-hand curves in FIG. 3. As shown, the frequency ranges of the lowpass filter 32 and highpass filter 33 are separated from each other by a range of intermediate frequencies. Rectifier-integrators 34 and 35 are respectively connected to the outputs of the filters 32 and 33 to detect the signal level of the low and high frequency components of the input signal impressed on the terminal 26 to generate control signals for application to the filters 28 and 30.

Figure 4:
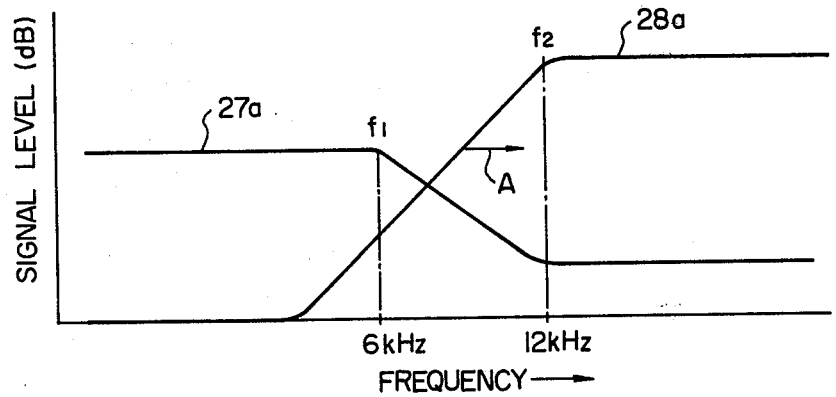
FIG. 4 is a graphic illustration of the frequency response characteristics of the high frequency de-emphasis filter and high frequency emphasis variable frequency filter of FIG. 2.

The high frequency de-emphasis filter 27 comprises a resistor R1 which is connected in a circuit between the terminal 26 and the amplifier 50, a circuit junction between the resistor R1 and amplifier 50 being connected to ground by a series circuit formed by a capacitor C1 and a resistor R2. As illustrated by a curve 27a in FIG. 4, frequencies above $f_2$ (=12 kHz) is attenuated or de-emphasized by a predetermined amount with respect to the level of signals in the lower frequency range below $f_1$ (=6 kHz), the signal in the intermediate frequency range between $f_1$ and $f_2$ having a gradually decreasing response characteristic.

The high frequency emphasis variable frequency filter 28 comprises a capacitor C2 connected in a circuit between the output of the amplifier 50 and the adder 29, a circuit junction between the capacitor C2 and adder 29 being connected to ground by a variable resistance element which is preferably formed by a semiconductor element such as field-effect transistor VR1. The control gate of the transistor VR1 is connected to the output of the rectifier-integrator 35 so that the impedance value of the field-effect transistor VR1 is varied inversely as a function of the output level of the circuit 35 and hence as a function of the level of the compressor input signal. As indicated by a curve 28a in FIG. 4, frequencies above $f_2$ are emphasized with respect to lower frequencies. This cutoff frequency point of curve 28a is 12 kHz when the compressor input level is at a minimum and shifted to the higher frequency end of the spectrum as a function of the compressor input level as indicated by an arrow A.

The low frequency emphasis variable level filter 30 comprises a resistor R3 connected in a circuit between the adder 29 and an adder 54, a circuit junction between the resistor R3 and adder 54 being connected to ground by a parallel circuit formed by a capacitor C3 and a field-effect transistor VR2 acting as a variable resistance element. The control gate of the transistor VR2 is connected to the output of the rectifier-integrator 34. The low frequency emphasis variable level filter 30 cooperates with the high frequency de-emphasis filter 27 to decrease the level of the lower frequency component of the compressor input signal inversely as a function of the level of the compressor output represented by the output of the rectifier-integrator 34.

Figure 5:
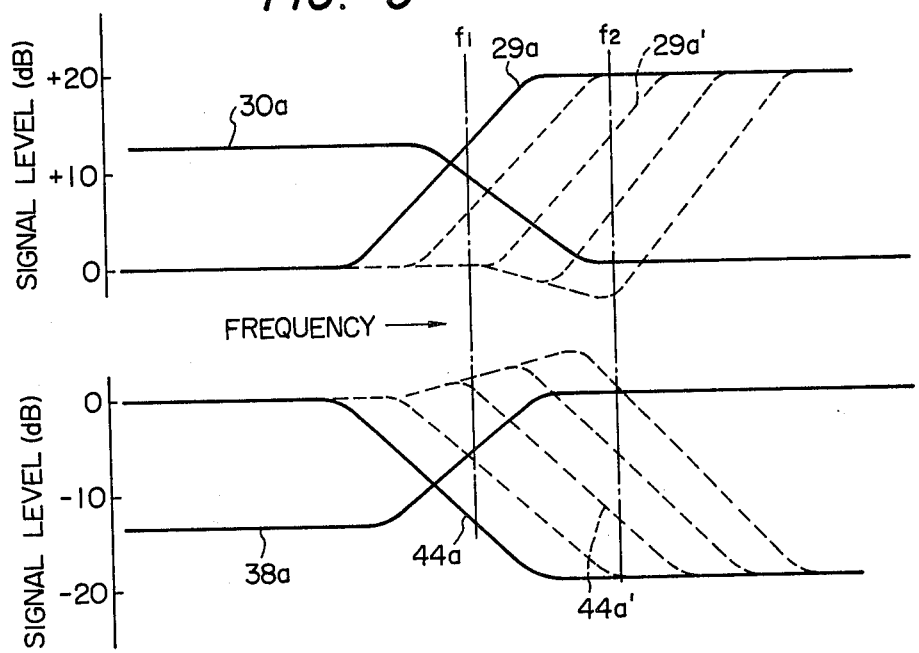
FIG. 5 is an illustration of the frequency response characteristics of the compressor and expander of FIG. 2.
Figure 6:
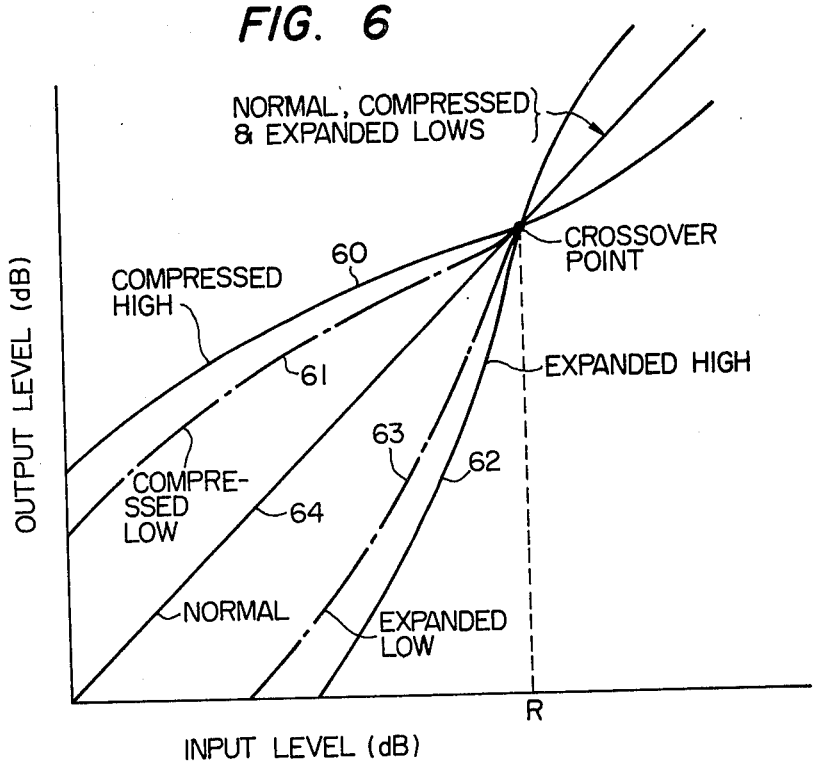
FIG. 6 is a graphic illustration of the compression and expansion characteristics of the invention as a function of input levels.

FIG. 5 is an illustration of the frequency response characteristics of the compressor circuit which result from the combined form of curves 29a and 30a. The curve 29a represents the high-frequency emphasis characteristic of the signal which appears at the output of adder 29, when the level of the higher frequency component of the compressor output is at a minimum. The frequency response is shifted to the higher frequency end of the spectrum with an increase in the output level as shown in broken line curves. Due to the high frequency de-emphasis characteristics of the filter 27, the minimum level of the lower frequency end of the signal from adder 29 falls below the zero dB level when the higher frequency output signal increases while the maximum level is maintained at a constant level of +20 dB over the high frequency range. This causes the higher frequency component to have a nonlinear compression characteristic as indicated by a solid line curve 60 (see FIG. 6) over the full range of the audio spectrum such that it forms a crossover point with the normal, or linear input-output characteristic. The higher frequency component of the compressor output is thus lower in level than the corresponding compressor input when the latter has a higher level than a predetermined point R. On the other hand, the curve 30a represents the output of the filter 30 which is characterized by a variable level emphasis over the lower frequency range of the audio spectrum. The level of this low frequency emphasis is varied in a range from about +14 dB to 0 dB inversely as a function of the level of the lower frequency component with the cutoff frequency point shifting to the higher frequency end, so that nonlinear input-output relationship is established for lower frequency component as indicated by a chain-dot curve 61 for input levels lower than the predetermined point R. Whereas, for input levels higher than the predetermined point R the lower frequency emphasis is maintained at the minimum level of 0 dB and compression is disabled to establish the normal input-output relationship.

Differently stated, the amount of emphasis provided by the low frequency emphasis variable level filter 30 is minimum (=0 dB) when the level of the low frequency component of the compressor input is higher than the predetermined value R, while the frequency response of the high frequency emphasis variable frequency filter 28 is defined by curve 29a' when the input level of the high frequency component of compressor input corresponds to the level R so that the cutoff frequency of the filter 28 can be still shifted toward the higher frequency end even if the input level R is exceeded.

The extension of the compression range for high frequency components while disabling the compression for low frequency components in respect of the higher input levels results in a significant improvement in the recording characteristic of the maximum output level in the higher frequency range.

The compressed signal is applied to an output terminal 31 and thence to a recording medium 36. Upon reproduction a signal from the recording medium 36 is applied to an input terminal 37 of an expander circuit having a complementary characteristic to that of the compressor circuit which is accomplished in a process inverse to that of the compressor circuit. The expander comprises a low frequency de-emphasis variable level filter 38 having a complementary characteristic to that of the low frequency emphasis variable level filter 30 of the compressor. The filter 38 includes a subtractor 57 having a positive input connected to the input terminal 37 and an output terminal connected to ground by a circuit including a resistor R4 and a capacitor C4 which is in parallel with a variable resistance element VR3, a circuit junction between the resistor R4 and capacitor C4 being connected to the negative input of the subtractor 57. The output of the subtractor 57 and hence the filter 38 is connected to the positive input of a subtractor 43 whose output is connected to its negative input by a capacitor C5, a circuit junction between the capacitor C5 and the negative input being connected to ground by a variable resistance element VR4 which forms with the capacitor C5 a high frequency de-emphasis variable frequency filter 44. The filter 44 has a complementary characteristic to that of the high frequency emphasis variable frequency filter 28 of the compressor circuit. A high frequency emphasis filter 45 having a complementary characteristic to that of the filter 27 of the compressor is connected between the output of subtractor 43 and an output terminal 46 of the expander circuit.

A lowpass filter 39 and a highpass filter 40 are connected to the input terminal 37. These filters have the same frequency ranges as those of filters 34 and 35 of the compressor to pass filtered low and high frequency signals to rectifier-integrators 41 and 42 which in turn applies control signals to the variable resistance elements VR3 and VR4, respectively.

The impedance value of the variable resistance element VR3 is varied inversely as a function of the level of the low frequency component of the expander input so that the frequency response characteristic of the expander in the low frequency range, shown at 38a in FIG. 5, is varied between a maximum de-emphasis of about −14 dB and a minimum of zero dB inversely as a function of the level of the low frequency component in a manner complementary to the curve 30a. On the other hand, the impedance value of the variable resistance element VR4 is varied inversely as a function of the level of the higher frequency component of the expander input so that the response characteristic in the higher frequency range, shown at 44a which is complementary to the curve 29a, is shifted to the higher frequency end as a function of the level of the high frequency component of the expander input. The high frequency emphasis filter 45 serves to impart an emphasis on the input signal to increase the lower frequency end of the higher frequency component in a manner complementary to that provided by the high frequency de-emphasis filter 27 of the compressor.

When the levels of the low and high frequency components of the expander input correspond to the predetermined value R, the amount of de-emphasis provided by the low frequency de-emphasis variable level filter 38 in minimum (=0 dB), while the frequency response of the high frequency de-emphasis variable frequency filter 44 adopts a curve 44a' when the high frequency expander input level corresponds to the level R so that the cutoff frequency of the filter 44 can be still shifted to the higher frequency end even though the input level R is exceeded. Therefore, the expander has a variable bandwidth which is a function of input signal level, resulting in expansion characteristics indicated by curves 62 and 63 (FIG. 6) for high and low frequency components, which curves are complementary to curve 60 and 61, respectively. The signal which appears at the expander output terminal 46 has therefore a linear amplitude relationship with the signal at the input terminal 26 of the compressor as indicated by a straight line 64 in FIG. 6.

The noise reduction system of the invention is advantageous in that it serves to suppress the higher frequency noise by a constant value (20 dB) regardless of input levels when the dominant component of the signal to be recorded or transmitted spreads over the lower to medium frequency range at a relatively low level, whereby the fluctuation of residual noise is significantly reduced.

It can be seen from the above that the series connection of filters in respective channels as taught by the invention results in an output signal free from distortion which might occur in the FIG. 1 prior system where the signal is frequency divided by branched filters. Furthermore, since the feedback control operation of the compressor and expander circuits as taught by the invention serves to control the cutoff frequencies of the series connected filters, drop-outs would only cause the cutoff frequencies to shift, so that the adverse effect of the drop-outs is rendered less noticeable as compared with the FIG. 1 prior art system in which the drop-outs would result in amplitude variations due to the use of variable gain amplifiers. Experiments showed that for input variations of less than 5 dB at the input terminal 37, the system of the invention is less responsive to such variations compared with the FIG. 1 prior art system.

It is obvious for those having ordinary skill in the art that the full spectrum range of the input signal may be divided into more than two different frequency bands to provide compression and expansion individually and that the connection of the various filters may be reversed in order.

What is claimed is:

1. A noise reduction system having a compressor and an expander having a complementary frequency response characteristic to the frequency response characteristic of the compressor, said compressor comprising: first input and output terminals, means connected to the first output terminal for generating a first control signal representing a high frequency component of a signal applied to said first output terminal, means connected to said first output terminal for generating a second control signal representing a low frequency component of said signal at said first output terminal, a high frequency emphasis variable frequency filter circuit of which the cutoff frequency is variable as a function of said first control signal, and a low frequency emphasis variable gain filter circuit of which the amount of emphasis is variable inversely as a function of said second control signal, said filter circuits being connected in a series circuit between said first input and output terminals, and said expander comprising;

a second input terminal adapted for connection to said first output terminal, a second output terminal, means connected to said second input terminal for generating a third control signal representing a high frequency component of the signal at said second input terminal, means connected to said second input terminal for generating a fourth control signal representing a low frequency component of said signal at said second input terminal, a low frequency de-emphasis variable gain filter circuit of which the amount of de-emphasis is variable inversely as a function of said fourth control signal, and a high frequency de-emphasis variable frequency filter circuit of which the cutoff frequency is variable as a function of said third control signal, said filter circuits being connected in a series circuit between said second input and output terminals.

2. A noise reduction system as claimed in claim 1, wherein the amount of emphasis of said low frequency emphasis variable gain filter circuit is minimum when said second control signal is greater in magnitude than a predetermined value and the cutoff frequency of said high frequency emphasis variable frequency filter circuit is lower than the highest cutoff frequency thereof when said first control signal has said predetermined value, and wherein the amount of de-emphasis of said low frequency de-emphasis variable gain filter circuit is minimum when said fourth control is greater in magnitude than a predetermined value and the cutoff frequency of said high frequency de-emphasis variable frequency filter circuit is lower than the highest cutoff frequency thereof when said third control signal has the last-mentioned predetermined value.

3. A noise reduction system as claimed in claim 2, wherein said series circuit of the compressor further includes a high frequency de-emphasis filter circuit, and wherein said series circuit of the expander further includes a high frequency emphasis filter circuit.

4. A noise reduction system as claimed in claim 1, 2 or 3, wherein said means for generating said first control signal comprises a highpass filter and a first rectifier-integrator which are connected in series to said first output terminal, the output of said first rectifier-integrator being connected to said high frequency emphasis variable frequency filter, and wherein said means for generating said second control signal comprises a lowpass filter and a second rectifier-integrator which are connected in series to said first output terminal, the output of said second rectifier-integrator being connected to said low frequency emphasis variable gain filter circuit, the cutoff frequencies of said highpass and lowpass filters being separated by a range of intermediate frequencies.

5. A noise reduction system as claimed in claim 1, 2 or 3, wherein said means for generating said third control signal comprises a highpass filter and a first rectifier-integrator which are connected in series to said second input terminal, the output of said first rectifier-integrator being connected to said high frequency de-emphasis variable frequency filter circuit, and wherein said means for generating said fourth control signal comprises a lowpass filter and a second rectifier-integrator which are connected in series to said second input terminal, the output of said second rectifier-integrator being connected to said low frequency de-emphasis variable gain filter circuit, the cutoff frequencies of said highpass and lowpass filters being separated by a range of intermediate frequencies.

6. A noise reduction system as claimed in claim 1, 2 or 3, wherein the maximum amount of emphasis of said low frequency emphasis variable gain filter circuit is smaller than the maximum amount of emphasis of said high frequency emphasis variable frequency filter circuit.

7. A noise reduction system as claimed in claim 6, wherein the maximum amount of de-emphasis of said low frequency de-emphasis variable gain filter circuit is smaller than the maximum amount of de-emphasis of said high frequency de-emphasis variable frequency filter circuit.

* * * * *